United States Patent
Deri et al.

(10) Patent No.: US 8,811,445 B2
(45) Date of Patent: Aug. 19, 2014

(54) ENHANCED VBASIS LASER DIODE PACKAGE

(75) Inventors: Robert J. Deri, Pleasanton, CA (US); Diana Chen, Fremont, CA (US); Andy Bayramian, Manteca, CA (US); Barry Freitas, Livermore, CA (US); Jack Kotovsky, Oakland, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 452 days.

(21) Appl. No.: 12/748,724

(22) Filed: Mar. 29, 2010

(65) Prior Publication Data

US 2011/0235669 A1    Sep. 29, 2011

(51) Int. Cl.
*H01S 5/00* (2006.01)
(52) U.S. Cl.
USPC ............... 372/50.23; 372/36; 372/50.12
(58) Field of Classification Search
USPC .......................... 372/36, 50.12, 50.23
See application file for complete search history.

(56) References Cited

U.S. PATENT DOCUMENTS

| | | | | |
|---|---|---|---|---|
| 5,285,463 | A * | 2/1994 | Takuma | 372/36 |
| 5,828,683 | A | 10/1998 | Freitas | |
| 5,923,481 | A | 7/1999 | Skidmore et al. | |
| 6,154,475 | A * | 11/2000 | Soref et al. | 372/45.011 |
| 6,710,926 | B2 | 3/2004 | Beach et al. | |
| 6,796,480 | B1 * | 9/2004 | Powers et al. | 228/103 |
| 2003/0193720 | A1 * | 10/2003 | Beach et al. | 359/623 |
| 2005/0047456 | A1 * | 3/2005 | Rice | 372/35 |
| 2009/0003398 | A1 * | 1/2009 | Moto | 372/36 |
| 2009/0104727 | A1 * | 4/2009 | Krejci et al. | 438/46 |

* cited by examiner

*Primary Examiner* — Tod T Van Roy
(74) *Attorney, Agent, or Firm* — Kilpatrick Townsend

(57) ABSTRACT

A substrate having an upper surface and a lower surface is provided. The substrate includes a plurality of v-grooves formed in the upper surface. Each v-groove includes a first side and a second side perpendicular to the first side. A laser diode bar assembly is disposed within each of the v-grooves and attached to the first side. The laser diode bar assembly includes a first adhesion layer disposed on the first side of the v-groove, a metal plate attached to the first adhesion layer, a second adhesion layer disposed over the metal plate, and a laser diode bar attached to the second adhesion layer. The laser diode bar has a coefficient of thermal expansion (CTE) substantially similar to that of the metal plate.

14 Claims, 5 Drawing Sheets

300

| Material | Thermal Cond K (W/m-K) | Heat Capacity C (J/ K-kg) | Density ρ (g/cm3) | sqrt(ρ C K) (MKS) | CTE (ppm/K) |
|---|---|---|---|---|---|
| n+ GaAs substrate | 44 | 322 | 5.317 | 8,679 | 6.5 |
| Cu:Diamond #0 | 550 | 450 | 4.87 | 34,718 | 6 |
| Cu:Diamond #1 | 470 | 440 | 5.5 | 33,725 | 6.7 |
| Cu:Diamond #2 | 518 | 446 | 5.14 | 34,460 | ~6.5 |
| Cu:Diamond #3 | 420 | 316 | 6.4 | 29,145 | ~6.5 |
| CuW 10:90 #0 | 180 | 160 | 17 | 22,127 | 6.5 |
| CuW 10:90 #1 | 175 | 149 | 17.17 | 21,159 | 6.51 |
| BeO | 250 | 1046 | 2.95 | 27,775 | 6.5 |
| CVD Diamond | 1800 | 502 | 3.515 | 56,357 | 1~1.5 |
| ALWIN Diamond | 1500 | 520 | 3.52 | 52,398 | 1~1.5 |
| Cu | 385 | 385 | 8.96 | 36,443 | 16.6 |
| 6H-SiC | 400 | 690 | 3.217 | 29,798 | 4.3 |
| Au | 301 | 132 | 19.32 | 27,737 | 14 |
| W | 173 | 187 | 19.3 | 25,003 | 4.5 |
| AlN (ANceram) | 180 | 738 | 3.31 | 20,969 | 4.2~5.3 |
| Mo | 138 | 250 | 10.22 | 18,777 | ~5.2 |
| AlN (sintered) | 170 | 600 | 3.255 | 18,221 | 4.2~5.3 |
| WC cermet | 84 | 250 | 15.8 | 18,218 | 4~7 |
| cubic BN | 200 | 600 | 2.18 | 16,174 | 1.2 |
| Si | 145 | 703 | 2.328 | 15,405 | 2.6 |
| BN ceramic | 71 | 1470 | 1.9 | 14,082 | 0.6 |
| MgO | 48 | 877 | 3.58 | 12,302 | 12.8 |
| In | 82 | 243 | 7.31 | 12,038 | |
| Sapphire | 42 | 761 | 3.98 | 11,265 | 5.0 (perp C) |
| AuSn 80:20 | 57 | 131 | 14.51 | 10,409 | |
| BN ceramic | 30 | 1610 | 1.9 | 9,580 | 3.1 |
| BN ceramic | 130 | 350 | 1.85 | 9,175 | |

ENHANCED VBASIS LASER DIODE PACKAGE

STATEMENT AS TO RIGHTS TO INVENTIONS MADE UNDER FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND OF THE INVENTION

Laser diode arrays are used in a wide range of commercial, medical and military applications: materials processing (soldering, cutting, metal hardening), display technology/graphics, medical imaging (MRI) and surgical procedures (corneal shaping, tissue fusion, dermatology, photodynamic therapy), satellite communication, remote sensing and laser isotope separation. In certain solid-state laser applications it is desirable to use laser diode arrays to optically excite, i.e., "pump," the crystal hosts. Diodes offer a narrow band of emission (reducing thermal lensing), compactness, high electrical efficiency and higher reliability as compared to flash lamps. Despite these numerous advantages, however, diode-pumped solid-state lasers (DPSSLs) have gained slow market acceptance due to the high cost associated with the laser diode array pumps. Significant diode array cost reductions would enable wide deployment of DPSSLs and new architectures to be realized that were previously cost prohibitive. In particular, low-cost diode arrays would bolster the inertial confinement fusion (ICF) and inertial fusion energy (IFE) programs that utilize low-repetition rate laser diode arrays in very high volumes.

As the laser diodes are driven at increasingly high output powers, the current laser diode packages are unable to meet the demand for increased heat dissipation. Thus, there is a need in the art for more a robust laser diode package that can provide increased reliability over existing laser diode packages.

SUMMARY OF THE INVENTION

Embodiments of the present invention are generally related to laser diode assemblies. More particularly, embodiments of the present invention provide a laser diode assembly with increased heat dissipation capacity.

Certain embodiments of the present invention provide a laser diode array. The laser diode array includes a substrate having an upper surface and a lower surface. V-grooves are formed in the upper surface and each v-groove includes a first side and a second side perpendicular to the first side. A laser diode bar assembly is disposed within each of the v-grooves and is attached to the first side. Laser diode bars are high-power semiconductor lasers, containing a one-dimensional array of broad-area emitters, or alternatively of sub-arrays containing 10-20 narrow stripes. Laser diode bars typically contain between 20 and 50 emitters, each being, e.g. 100 µm wide. The laser diode bar assembly includes a first adhesion layer disposed on the first side of the v-groove, a metal plate attached to the first adhesion layer, a second adhesion layer disposed over the metal plate, and a laser diode bar attached to the second adhesion layer. The metal plate has a coefficient of thermal expansion (CTE) substantially similar to that of the laser diode bar.

In some embodiments, the metal plate includes a first copper layer, a molybdenum layer attached to the first copper layer, and a second copper layer attached to the molybdenum layer. In some embodiments, the laser diode array further comprises a monolithic microlens array disposed over the plurality of laser diode bars where each of the laser diode bars is disposed within each of the v-grooves.

Some embodiments of the present invention provide a laser diode assembly. The laser diode assembly includes a mounting substrate configured to provide structural support to the diode assembly. A first layer including a first solder material is disposed on the mounting substrate. A heat spreader structure is attached to the first layer. A second layer including a second solder material is disposed on the heat spreader structure, and a laser diode bar is attached to the second layer.

In still other embodiments, a method for manufacturing a laser diode assembly is provided. The method includes providing a substrate having an upper surface and a lower surface. The method further includes forming a plurality of v-grooves in the upper surface of the substrate and forming a metal layer lining at least a portion of the plurality of v-grooves. In addition, the method includes forming a first adhesion layer that is disposed on the metal layer, forming a heat spreader structure over the first adhesion layer, forming a second adhesion layer over the heat spreader structure, and attaching a laser diode bar to the heat spreader structure using the second adhesion layer.

Embodiments of the present invention provide a more reliable package design that can effectively dissipate heat produced by the laser diodes in high-power applications. In addition, the v-grooves of the package according to an embodiment of the present invention can be formed by etching the silicon crystal in a manner to accommodate longer laser bars. In order to provide good thermal dissipation performance, it would be beneficial to use materials that have similar CTE's so as to reduce stress on the individual components of the laser diode package. However, matching the CTE of different materials is not trivial as there are many factors that need to be addressed. These issues and their solutions are described below in reference to embodiments of the present invention.

The following detailed description, together with the accompanying drawings will provide a better understanding of the nature and advantages of the present invention.

DETAILED DESCRIPTION OF SPECIFIC EMBODIMENTS

Embodiments of the present invention are generally related to laser diode packages. More specifically, certain embodiments of the present invention provide a laser diode package with an increased heat dissipation capacity.

Figure 1:
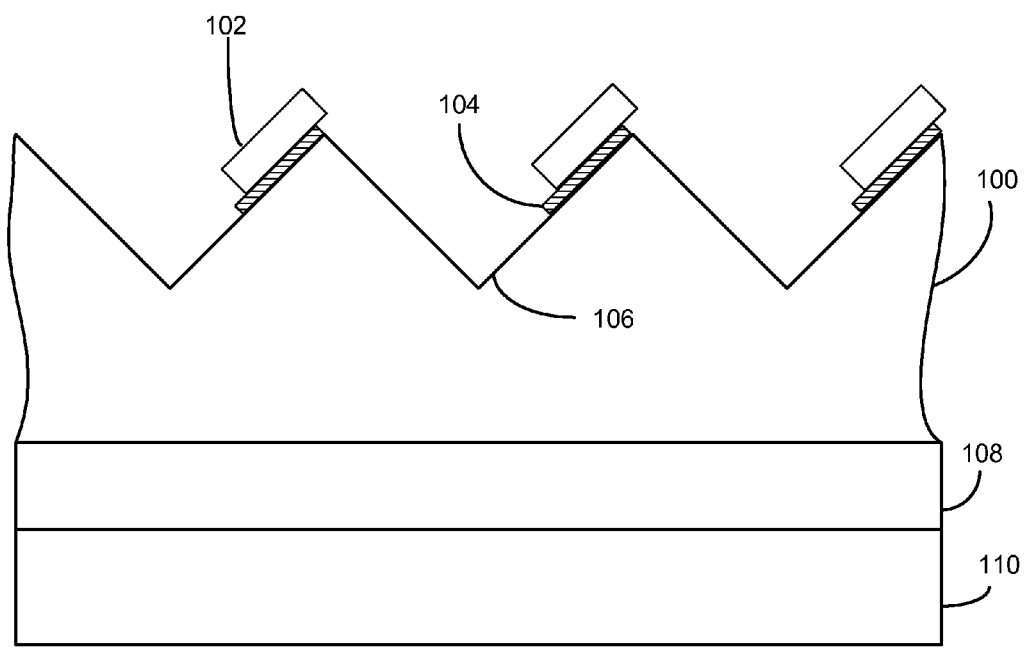
FIG. 1 illustrates a conventional laser diode package.

FIG. 1 shows a conventional laser diode array package. The package shown in FIG. 1 includes a molybdenum block 110. A layer of aluminum nitride (AlN) 108 is disposed over molybdenum block 110. A substrate 100 is attached to AlN layer 108. A series of v-grooves 106 are formed in an upper surface of silicon substrate 100. A solder material 104 is applied over a side surface of each v-groove 106. A laser diode bar 102 is attached to each v-groove 106 using solder material 104.

The coefficient of thermal expansion (CTE) of the laser diode bar is different from the CTE of the silicon. For example, the difference in CTE's (ΔCTE) of the laser bar and the silicon substrate in the package of FIG. 1 is approximately 3.3 ppm/K. In low power applications, solder material 104 may be able to handle the stress created due to the CTE mismatch. However, in high-power applications it has been observed that solder material 104 suffers from reliability issues. In some high power applications, the laser diode bars may be operated with a 350 μs pulse and approximately a 0.4% duty cycle, requiring about 500 amps of current for its operation. Duty cycle of a laser diode is the proportion of time during which the laser diode is operated or turned 'on'. For example, if a laser diode operates for 1 second, and is shut off for 99 seconds, then it is operated for 1 second again, and so on, then the laser diode is operational for one out of 100 seconds, or 1/100 of the time, and its duty cycle is therefore 1/100, or 1 percent. If the laser diode bar includes between 25 and 35 laser diodes, an enormous amount of heat is generated by each laser diode bar in a short period of time. In some applications, about 500 W of heat may be present at the laser bar/solder interface. The current solder material suffers from reliability issues when the laser diode bar is operated at such high power levels. Specifically, solder material 104 has electromigration issues at high current levels and is not reliable for long term operations. In general, electromigration is the transport of material caused by the gradual movement of the ions in a conductor due to the momentum transfer between conducting electrons and diffusing metal atoms. As the laser diodes are operated at high outputs, they draw a large current, resulting in the increase of the electromigration effect. Eventually, electromigration leads to a failure of the solder material, resulting in failure of the laser diode assembly itself. In addition, since high amount of heat is generated in a small amount of time, it puts stress on solder material 104 as well as the substrate due to the CTE mismatch.

The grooves in the package illustrated in FIG. 1 are typically formed by etching along the crystal planes of the silicon. Hence, the angle of each groove is fixed and depends on the crystal plane. Consequently the length of the laser bar that can be accommodated in the groove is also limited by the angle of the v-groove. For example, currently the length of the laser bar is approximately 1 mm. One of the methods for increasing the output from each laser bar is to accommodate more laser diodes in each laser bar. To accommodate more laser diodes in each laser bar, the length of the laser diode bar may need to be increased. However, the dimensions of v-grooves, as shown in FIG. 1, may not be able to accommodate longer laser bars due to their design. As used herein, length of the laser diode bar refers to the dimension perpendicular to the plane of FIG. 1, i.e. the dimension as measured going into the paper. The length of the laser diode bar is not visible in FIG. 1, but would be visible in a top view of FIG. 1.

Figure 2:
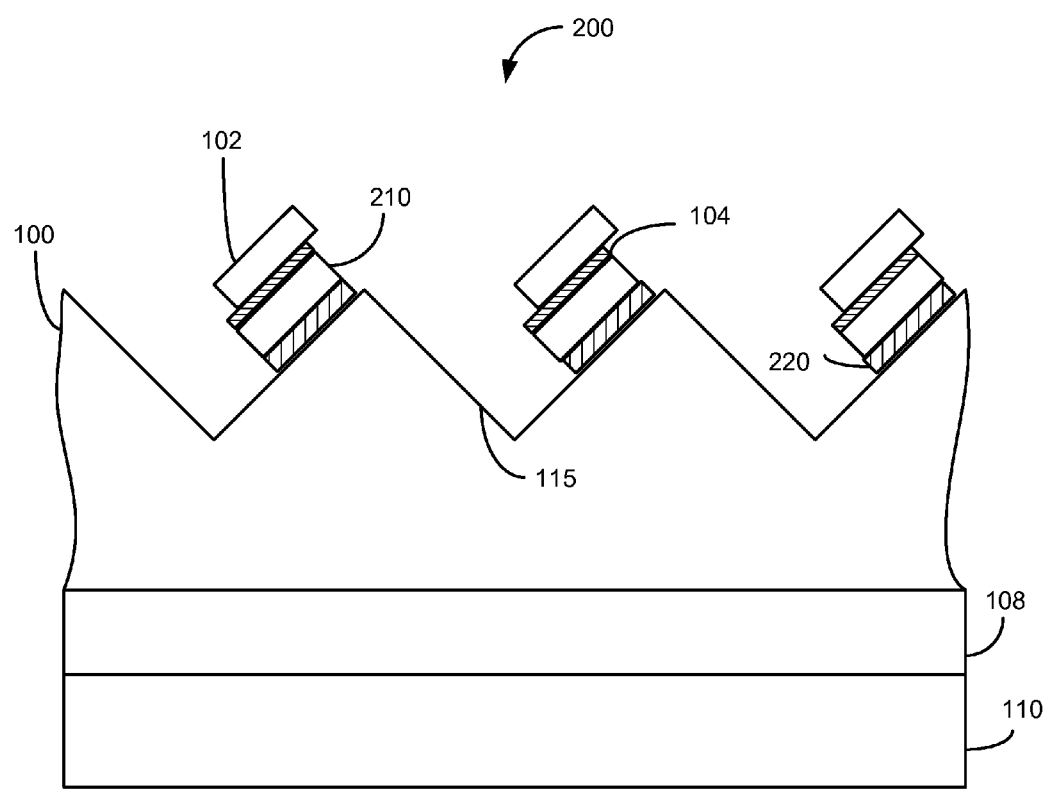
FIG. 2 illustrates a V-basis laser diode package according to an embodiment of the present invention.

FIG. 2 illustrates a laser diode package 200 according to an embodiment of the present invention. Package 200 includes a support block 110. In some embodiments, support block 110 can include molybdenum or other suitable metal that provides mechanical rigidity. A spacer 108 is disposed over metal block 110. In some embodiments, spacer 108 can comprise aluminum nitride (AlN) or other suitable material. Spacer 108 helps provide electrical isolation of the laser diode bar assembly from the metal support block. A silicon substrate 100 is coupled to spacer 108. In some embodiments, an indium based solder material can be used to attach substrate 100 to spacer 108. A plurality of v-grooves 115 are formed in an upper region of substrate 100, typically comprising single crystal silicon. In other embodiments, substrate 100 can be a silicon-on-insulator (SOI) substrate. V-grooves 115 are formed by cutting or etching substrate 100. Additional details of forming the v-grooves are disclosed in commonly owned U.S. Pat. No. 5,828,683, the content of which is incorporated by reference herein in its entirety for all purposes. In some embodiments, substrate 100 is etched along the crystal planes to form v-grooves 115. Preferably, an anisotropic wet etching process is utilized in which the etch rate is highly dependent on the silicon crystal lattice orientation. For example, an anisotropic etching process can be used that preferentially etches along the <110> crystal plane. To from the v-grooves, a masking layer, for example, a hard mask fabricated using a silicon oxide or silicon nitride film, is deposited and patterned on surface of substrate 100. Then substrate 100 is exposed to a wet etchant solution, e.g., a heated potassium hydroxide and water ($KOH/H_2O$) solution. Other etch chemistries, including tetramethylammonium hydroxide (TMAH) and ethylenediamine pyrocatecol (EDP), are utilized in other embodiments for forming the v-grooves.

In other embodiments, substrate 100 can be etched along a plane that is "off" a crystal axis of substrate 100. By forming v-grooves in this manner, the v-grooves can be made deeper such that each v-groove can accommodate a longer laser diode bar.

Each of the v-grooves 115 can accommodate a single laser diode bar 102. Each v-groove 115 includes a solder material 220 applied to one of the sides of the v-groove. In some embodiments, solder material 220 is an indium based solder. Solder material 220 serves to anchor the laser diode bar to substrate 100. In some embodiments, the sides of each v-groove are lined with a conductive material (not shown), e.g., silver, that provides an electrical path for providing power to the laser diode bar. A heat spreader 210 is attached to solder material 220. In some embodiments, the attachment of heat spreader 210 is done by vapor depositing a thin film of solder material 220 onto the entire surface of the substrate that the heat spreader will mount to. Heat spreader 210 is then placed into position. The assembly is then placed onto a heater plate that is mounted inside a vacuum chamber. To do a flux free soldering process, all the air is removed from the chamber and then a reactive gas, e.g., hydrogen, is purged into the vacuum chamber with a flowing pressure of approximately 10 torr. To assure a good bond of the heat spreader to the substrate, some means of pressing the heat spreader against the substrate may be utilized. In some embodiments, a fixture with a 0.010" thick silicone sheet bladder and a trapped volume of 1 atmosphere of air is placed and secured over the unsoldered heat spreader. When the pressure is reduced in the vacuum chamber the bladder inflates. The bladder conforms over the heat spreader and the substrate, thus applying a force to push the heat spreader into the v-groove of the substrate. The assembly is heated to the melting point of solder material 220, and then cooled, thus completing the soldering of the heat spreader.

In some embodiments, the laser bar can be attached to the heat spreader prior to placement in the v-grooves. This enables testing of the laser bar prior to assembling the V-basis package. In this embodiment, the manufacturing costs can be significantly reduced since only the laser bars that pass the testing are mounted in the v-grooves.

Details of the structure of heat spreader 210 are provided below. Heat spreader 210 preferably comprises copper, diamond, tungsten, molybdenum, or combinations thereof. Heat spreader 210 is coupled to laser diode bar 102 via an adhesion layer 104, preferably including, gold and tin. A similar process, as described above in connection with the heat spreader, can be used to mount laser diode bar 102 to heat spreader 210.

Figure 4:
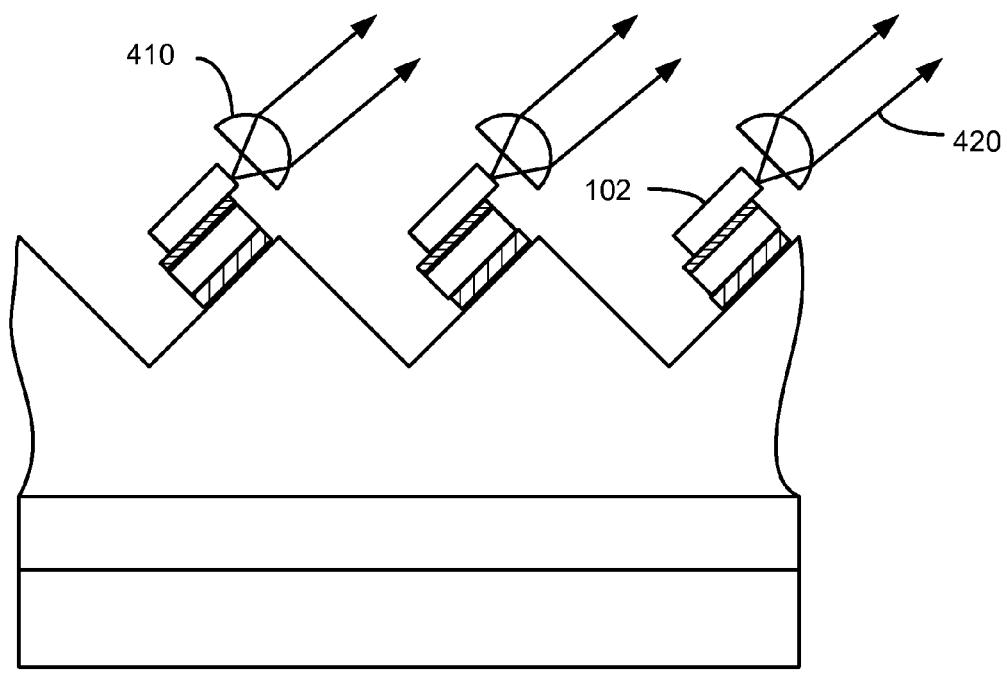
FIG. 4 is a schematic of a laser diode package with a monolithic lens array according to an embodiment of the present invention.

If the focusing of the laser beams is needed, a monolithic microlens array can be disposed over the output face of each laser diode bar 102. FIG. 4 shows a schematic of a laser diode package with a monolithic microlens array mounted over the laser diode bar 102 such that light 420 coming out of each laser diode bar 102 is collimated. The monolithic array includes several microlenses 410 that are located at the output face of each laser diode bar 102. The microlens array may a monolithic structure with individual microlenses collimating the light coming out of each laser diode bar. The monolithic microlens structure also collimates all the light coming out of all laser diodes on a laser diode bar into a single beam. In some embodiments, the monolithic array can be fabricated on a glass substrate. In some instances, there may be misalignment of the monolithic array due to expansion mismatch between the microlens substrate and the silicon substrate. To correct this misalignment, the microlens array can be defocused.

As described above, the laser diodes are operated in a pulsed manner. For example in one implementation, the laser diodes are turned on for 350 μs with a 0.4% duty cycle. In some embodiments, during such a pulsed operation, each laser diode bar draws about 500 Amps of current and approximately 500 W of heat is generated by each laser diode bar at the interface of the laser diode and adhesion layer 104. During the 350 μs that the laser diodes are on, the generated heat spreads to a depth of about 250 μm from the laser diode bar/adhesion layer junction. Thus thermal transport through the first 200 μm of material needs to be managed effectively to provide efficient thermal dissipation. Conventional cooling techniques like cooling fluid circulation are not enough to dissipate the heat produced. Thermal management in devices operated in this manner does not merely depend on the thermal conductivity of the material because the goal is not to merely remove the heat generated in a time-dependent, steady-state manner, but rather to quickly remove the heat from the laser during a rapid transient over a short time period defined by the duty cycle of the operation of the laser diode. Therefore the materials used for dissipating the heat are preferably chosen to maximize a particular set of material parameters, e.g., as defined by a figure of merit discussed below.

There are two requirements, among others, for a material to be used for heat dissipation in the above-mentioned operating conditions. According to embodiments of the present invention, the CTE of the heat spreader material closely matches the CTE of the laser diode bar. This reduces the stress on the solder material and on the silicon substrate. Lower stress results in longer life and reliability of the package. Materials with a high figure of merit (FOM) are utilized. A figure of merit (FOM) is a quantity used to characterize the performance of a device, system or method, relative to its alternatives. FOM may be defined for a particular material or device in order to determine its relative utility for an application. In this instance, the effectiveness of the heat spreader, e.g., heat spreader 210 of FIG. 2, depends on its Density ($\rho$ (rho)), specific heat capacity (C), and Thermal conductivity (K) of the material used to fabricate the heat spreader. For example, the FOM for the heat spreader can be defined as $$FOM = sqrt(\rho * C * K) \quad (1)$$

The maximum temperature change ($T_{max}$) depends on the optical properties of other components included in the system and the performance requirements of the particular system.

$$T_{max} \sim (2/sqrt(\pi)) * sqrt(time)/FOM \quad (2)$$

Figure 3:
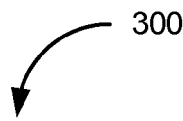
FIG. 3 is a table illustrating the thermal dissipation and co-efficient of thermal expansion (CTE) parameter for various materials that can be used in embodiments of the present invention.
Figure 5:
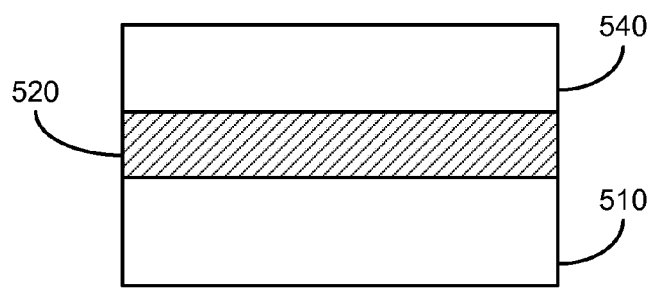
FIG. 5 is a schematic of a heat spreader structure according to an embodiment of the present invention.

Therefore, it would be beneficial to have a material that has a high value for ($\rho * C * K$). FIG. 3 shows a table 300 illustrating various materials including the FOM value and CTE value for each of the materials. In some embodiments, the laser diodes comprise Gallium Arsenide (GaAs). The CTE of the GaAs laser diode is about 6.5 ppm/K. So, the CTE of the heat spreader materials utilized herein closely match the CTE of GaAs in to reduce the stress on other components of the package. At the same time, the heat spreader should desirably have a high enough FOM to make it a viable heat dissipation component. As seen from table 300, there are several materials that can achieve the desired CTE with a high FOM. Some of the materials that can be used to fabricate the heat spreader are copper, copper-diamond composite, or copper-tungsten composite. In some embodiments, the heat spreader is a multilayered structure. For example, as shown in FIG. 5, the heat spreader can include a layer of molybdenum 520 sandwiched between two copper layers 510 and 540. In other embodiments the heat spreader is a copper/tungsten (CuW) pseudo alloy or a copper/diamond composite structure. By choosing the appropriate materials in a multilayered structure, the CTE and the FOM values can be manipulated to get the desired outcome. In some embodiments, the CTE difference (ΔCTE) between the laser diode bar and the heat spreader can be reduced to between 0.1 and 0.6 ppm/K by proper choice of materials to form the heat spreader. In an exemplary embodiment, the ΔCTE between the heat spreader and the laser diode is about 0.5 ppm/K.

In addition to the above features, preferably the dimensions and alignment of the heat spreader are controlled precisely to interference with the output of the laser diode bar. Given the heat spreader dimensions and alignment requirements at a microscopic level, this can be difficult. In some embodiments, the thickness of the heat spreader is between 300 μm and 600 μm and the thickness of the heat spreader is controlled within a tolerance range of between 10 μm and 50 μm. The heat spreader is aligned to the laser diode bar such that the length of the heat spreader is approximately equal to or slightly less than the length of the laser diode bar. In some embodiments, the length of the heat spreader is approximately 1 mm with a tolerance of about ±5 μm. The heat spreader is aligned with the laser diode bar such that a front edge of the laser diode bar is flush with a front edge of the heat spreader. In some embodiments, the maximum misalignment tolerance is about ±8 μm.

Figure 6:
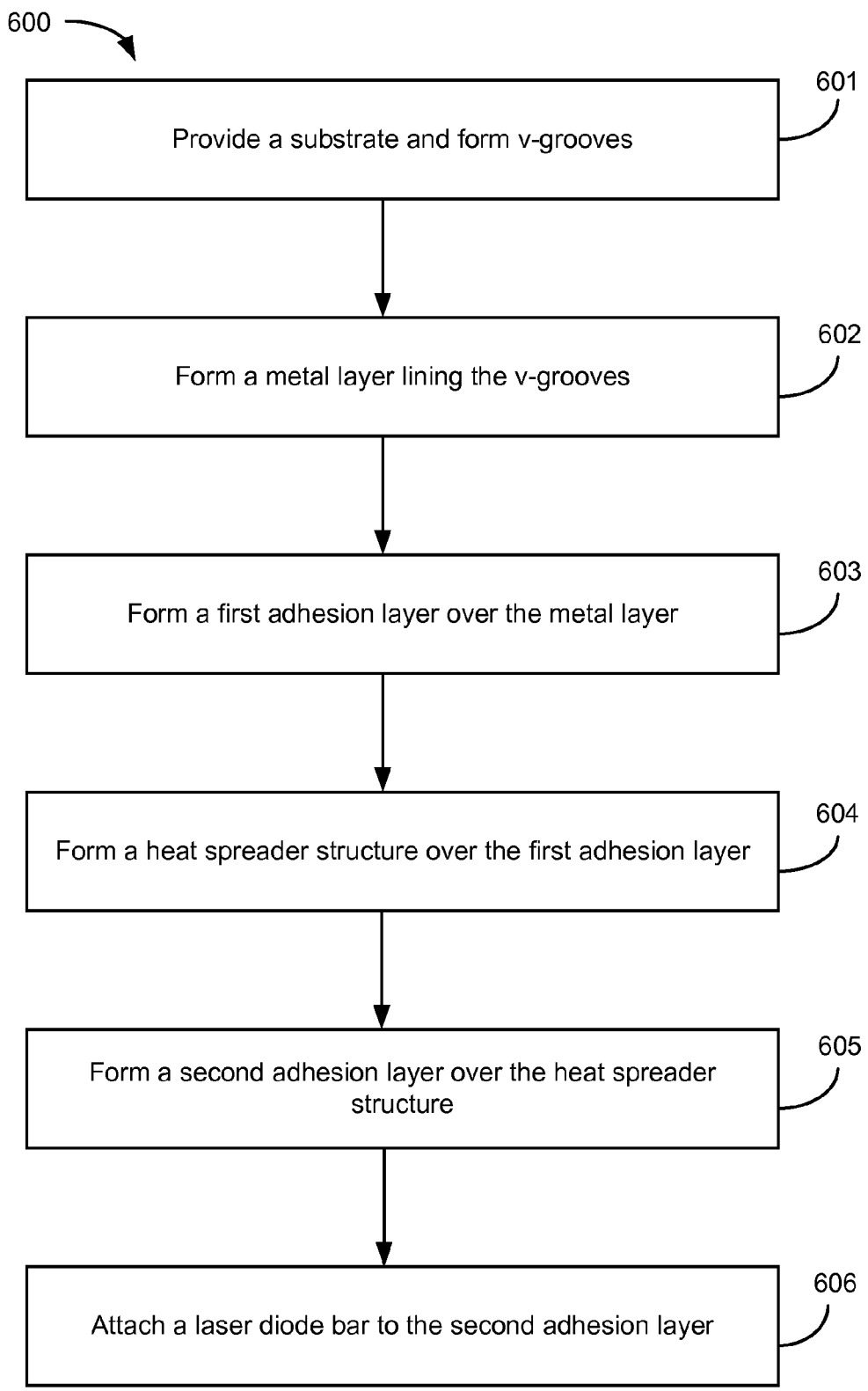
FIG. 6 is a flow diagram of a process for manufacturing a V-basis package according to an embodiment of the present invention.

FIG. 6 is a flow diagram of a process 600 for manufacturing a laser diode bar assembly according to an embodiment of the present invention. At step 601, a substrate is provided. Subsequently, a plurality of v-grooves are formed in the substrate, e.g., using the etching process described above. At step 602, a metal layer such as silver is formed on the sides of the v-grooves. A first adhesion layer, e.g., a solder material comprising indium, is formed over the metal layer at step 603. At step 604, a heat spreader structure is formed over the first adhesion layer. As described above, the heat spreader structure can be a monolithic structure or a multilayered structure including copper, tungsten, diamond, molybdenum, or combinations thereof. At step 605, a second adhesion layer, e.g., comprising gold and tin solder material, is formed over the heat spreader. At step 606, a laser diode bar is attached to the second adhesion layer. In some embodiments, a monolithic microlens array is attached to the laser diode package such that the microlens is disposed over the output face of each laser diode bar thereby collimating the light coming out of each laser diode bar.

It should be appreciated that the specific steps illustrated in FIG. 6 provide a particular method of manufacturing a laser diode package according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives. For example, instead of forming v-grooves in a substrate, a substrate with pre-made grooves can be provided. This eliminates the extra step of forming the v-grooves.

In some embodiments, the silicon substrate is subjected to ion bombardment to increase the resistivity of the silicon substrate to a semi-insulating state. In one embodiment, the silicon substrate is implanted with hydrogen ions, e.g., at about 180 keV to a dose of about $2.7\times10^{16}$ cm$^{-2}$, followed by annealing the silicon substrate. During the annealing, damage regions produced by hydrogen ion implantation epitaxially grow on the underlying undamaged single crystal silicon and many interior hydrogen bubbles are formed beneath surface layer after epitaxy of damage regions. Subsequently, the bubble-related defect layers are buried beneath surface layers. The interior bubbles do not move during annealing. So the bubble-related defects have very high thermal stability, high structural stability, and a high resistivity of up to $10^3$ $\Omega$cm or higher. In some embodiments, helium ions are used instead of hydrogen ions to increase the resistivity of the silicon substrate.

In some embodiments, oxygen ions are implanted into the silicon substrate using conventional ion implantation techniques. The substrate is then annealed to form an insulating layer of silicon dioxide on the surface of the substrate. Increasing the resistivity of the silicon substrate can help to eliminate the aluminum nitride layer described in FIG. 1. This will further reduce the manufacturing complexity and costs. In some embodiments, instead of the aluminum nitride layer, an insulating layered structure can be used, e.g., by sandwiching an insulating material between two copper plates. The insulating material can be sapphire, indium-phosphide, or silicon carbide.

Numerous benefits are realized by using the heat spreader described above. By having the CTE of the heat spreader closely match the CTE of the laser diode bar reduces the stress created when the laser diode bar expands during the operation. Since both the laser diode bar and the heat spreader expand at a similar rate, the stress on the first adhesion layer, the second adhesion layer and the substrate is greatly reduced. Second, by choosing a material having a high FOM value, the heat generated by the laser diode bar is effectively dissipated thus prolonging the life of the laser diode bar and the laser diode package. By controlling the dimensions of the heat spreader within the described tolerance limits, there is no effect on the light output from the laser diode bar.

It should be noted that the examples and embodiments described herein are for illustrative purposes only and that various modifications or changes in light thereof will be suggested to persons skilled in the art and are to be included within the spirit and purview of this application and scope of the appended claims.

What is claimed is:

1. A laser diode array comprising:
   a substrate having an upper surface and a lower surface;
   a plurality of v grooves formed in the upper surface, each v groove including a first side and a second side perpendicular to the first side; and
   a plurality of laser diode bar assemblies, wherein a laser diode bar assembly is disposed within each of the v grooves and attached to the first side, wherein the laser diode bar assembly includes:
      a first adhesion layer disposed on the first side of the v groove;
      a metal plate attached to the first adhesion layer;
      a second adhesion layer disposed over the metal plate; and
      a laser diode bar attached to the second adhesion layer, wherein, the laser diode bar is characterized by a coefficient of thermal expansion (CTE) substantially similar to that of the metal plate; and
   a monolithic lens array including a plurality of lenses configured to collimate light emitted by the plurality of laser diode bar assemblies, wherein the monolithic lens array is formed on a single substrate; and wherein the plurality of lenses are defocused to compensate for CTE mismatch between the CTE of the laser diode bar and a CTE of the single substrate that forms the monolithic lens array.

2. The laser diode array of claim 1 wherein the first adhesion layer includes an indium based solder material.

3. The laser diode array of claim 1 wherein the metal plate includes a plurality of layers comprising:
   a first copper layer;
   a molybdenum layer attached to the first copper layer; and
   a second copper layer attached to the molybdenum layer.

4. The laser diode array of claim 1 wherein the second adhesion layer includes gold and tin.

5. The laser diode array of claim 1 wherein the metal plate has a thickness of between 300 μm to 600 μm.

6. The laser diode array of claim 1 wherein the silicon substrate is a silicon-on-insulator (SOI) substrate.

7. A laser diode assembly comprising:
   a silicon-on-insulator (SOI) mounting substrate configured to provide structural support to the diode assembly;
   a first layer including a first solder material disposed on the SOI mounting substrate;
   a heat spreader structure attached to the first layer;
   a second layer including a second solder material disposed on the heat spreader structure;
   a laser diode bar attached to the second layer; and
   a lens disposed over the laser diode bar, wherein the lens is part of a monolithic lens array that includes a plurality of lenses formed on a single substrate; and wherein the plurality of lenses are defocused to compensate for a coefficient of thermal expansion (CTE) mismatch between a CTE of the laser diode bar and a CTE of the single substrate that forms the monolithic lens array.

8. The laser diode assembly of claim 7 wherein the heat spreader is characterized by a thickness of between 300 μm and 600 μm.

9. The laser diode assembly of claim 8 wherein a tolerance value for the thickness of the heat spreader is between 10 μm and 50 μm.

10. The laser diode assembly of claim 7 wherein the heat spreader is a multilayer structure and includes at least one of copper, diamond, tungsten, or molybdenum.

11. The laser diode assembly of claim 7 wherein the first layer comprises indium.

12. The laser diode assembly of claim 7 wherein the second layer comprises gold and tin.

13. The laser diode assembly of claim 7 wherein the heat spreader has a coefficient of thermal expansion substantially similar to that of the laser diode bar.

14. The laser diode assembly of claim 7 wherein the heat spreader structure is selected based on a figure of merit (FOM), wherein:

$$FOM = \sqrt{\rho * C * K};$$

where $\rho$ is a density of the heat spreader structure, C is a specific heat capacity of the heat spreader structure, and K is a thermal conductivity of the heat spreader structure.

* * * * *